(12) United States Patent
Koike

(10) Patent No.: US 6,726,799 B2
(45) Date of Patent: Apr. 27, 2004

(54) PLASMA ETCHING APPARATUS WITH FOCUS RING AND PLASMA ETCHING METHOD

(75) Inventor: Osamu Koike, Kanagawa (JP)

(73) Assignee: Semiconductor Leading Edge Technologies, Inc., Kanagawa (JP)

( * ) Notice: Subject to any disclaimer, the term of this patent is extended or adjusted under 35 U.S.C. 154(b) by 154 days.

(21) Appl. No.: 09/986,044

(22) Filed: Nov. 7, 2001

(65) Prior Publication Data
US 2002/0072240 A1 Jun. 13, 2002

(30) Foreign Application Priority Data
Dec. 7, 2000 (JP) .......................... 2000-372798

(51) Int. Cl.⁷ .............................. H05H 1/00; C23C 16/00
(52) U.S. Cl. ........................ 156/345.24; 156/345.51; 118/695; 118/712; 118/728
(58) Field of Search ................. 156/345.24, 345.51; 118/695, 712, 728; 438/710, 714

(56) References Cited

U.S. PATENT DOCUMENTS 5,213,658 A * 5/1993 Ishida .......................... 216/67
6,228,563 B1 * 5/2001 Starov et al. ............... 430/327

FOREIGN PATENT DOCUMENTS

| JP | 4-162623 | 6/1992 |
| JP | 10-092796 | 4/1998 |
| JP | 2001-230239 | 8/2001 |

* cited by examiner

Primary Examiner—Parviz Hassanzadeh
(74) Attorney, Agent, or Firm—Foley & Lardner

(57) ABSTRACT

A focus ring is disposed along a circumference of a semiconductor substrate on a lower electrode. A sensor measures a position of an upper surface of the focus ring, and a drive mechanism 6 drives the focus ring vertically. A controller adjusts the position of the upper surface of the focus ring to a desired position by driving the drive mechanism on the basis of a result of measurement by the sensor.

6 Claims, 2 Drawing Sheets

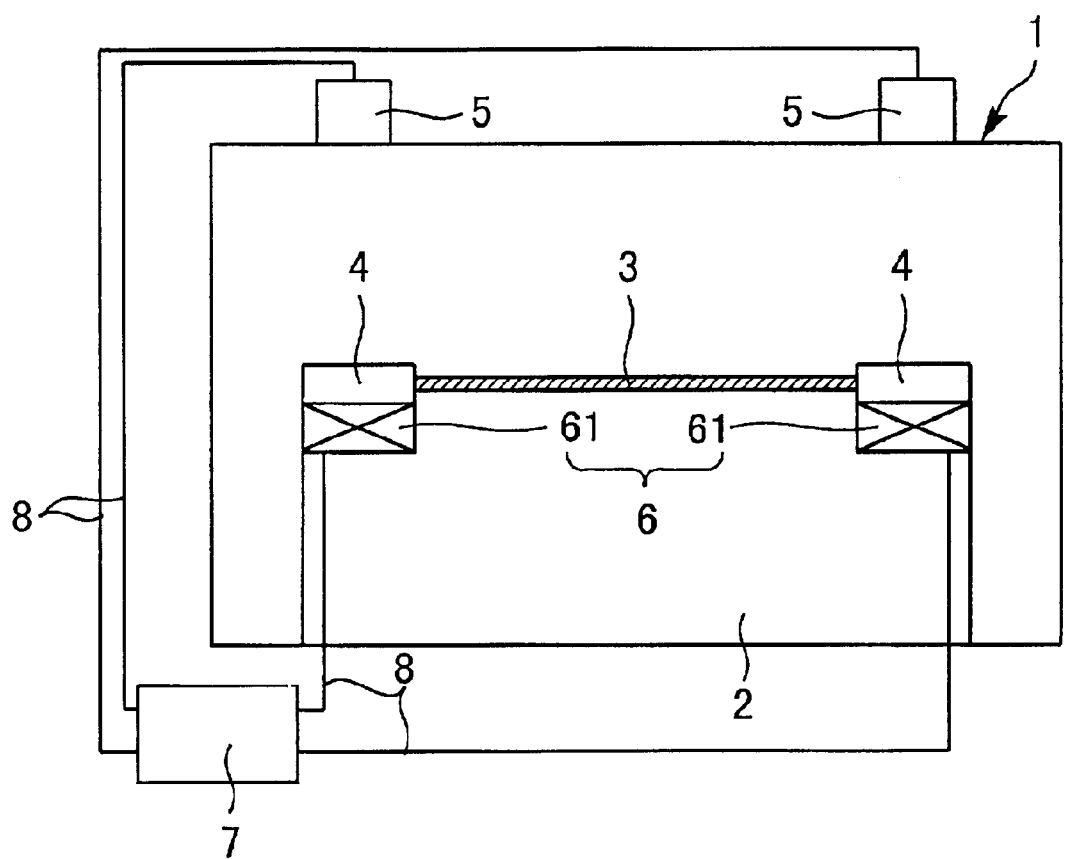

PLASMA ETCHING APPARATUS WITH FOCUS RING AND PLASMA ETCHING METHOD

BACKGROUND OF THE INVENTION

1. Field of the Invention

The present invention relates to a semiconductor device, and more specifically to a plasma etching apparatus and a plasma etching method.

2. Description of the Background Art

In a plasma etching apparatus, a focus ring is used for controlling plasma in the vicinity of the circumference of a wafer. Thereby, an etching rate at the circumferential area of the wafer is controlled. Also, it has been known that the etching rate at the circumferential area of the wafer depends on a height of the focus ring.

However, the focus ring is exposed to plasma during etching. Therefore, when an etching apparatus is used for a long period of time, the focus ring is corroded by an etching gas, and a height of the focus ring changes.

Thereby, the etching characteristics change at the circumferential area of the wafer, and a uniformity of the etching rate on the surface of the wafer becomes worse.

Also, the focus ring must be replaced every time after a certain number of wafers have been processed, and consequently there was a problem of increasing running costs of a dry-etching apparatus.

SUMMARY OF THE INVENTION

The present invention has been conceived to solve the previously-mentioned problems and a general object of the present invention is to provide a novel and useful plasma etching apparatus and to provide a novel and useful plasma etching method.

A more specific object of the present invention is to maintain the etching rate at the circumferential area of the wafer constant without replacing any focus ring.

The above object of the present invention is attained by a following plasma etching apparatus and a following plasma etching method.

According to one aspect of the present invention, the plasma etching apparatus comprises: a lower electrode supporting a semiconductor substrate; a focus ring disposed along a circumference of the semiconductor substrate; a sensor for measuring a position of an upper surface of the focus ring; a drive mechanism for driving the focus ring vertically; and a controller for adjusting the position of the upper surface of the focus ring by driving the drive mechanism on the basis of a result of measurement by the sensor.

According to another aspect of the present invention, the plasma etching method comprises; a measurement step of measuring an upper surface of a focus ring; an adjustment step of adjusting a position of the upper surface of the focus ring by driving the focus ring vertically on the basis of the result of measurement by the measurement step; and an etching step of performing etching after finishing the adjustment step.

Other objects and further features of the present invention will be apparent from the following detailed description when read in conjunction with the accompanying drawings.

BRIEF DESCRIPTION OF THE DRAWINGS

FIG. 2 is a conceptual diagram for illustrating a plasma etching apparatus and a plasma etching method according to a second embodiment of the present invention.

DETAILED DESCRIPTION OF THE PREFERRED EMBODIMENTS

Figure 1:
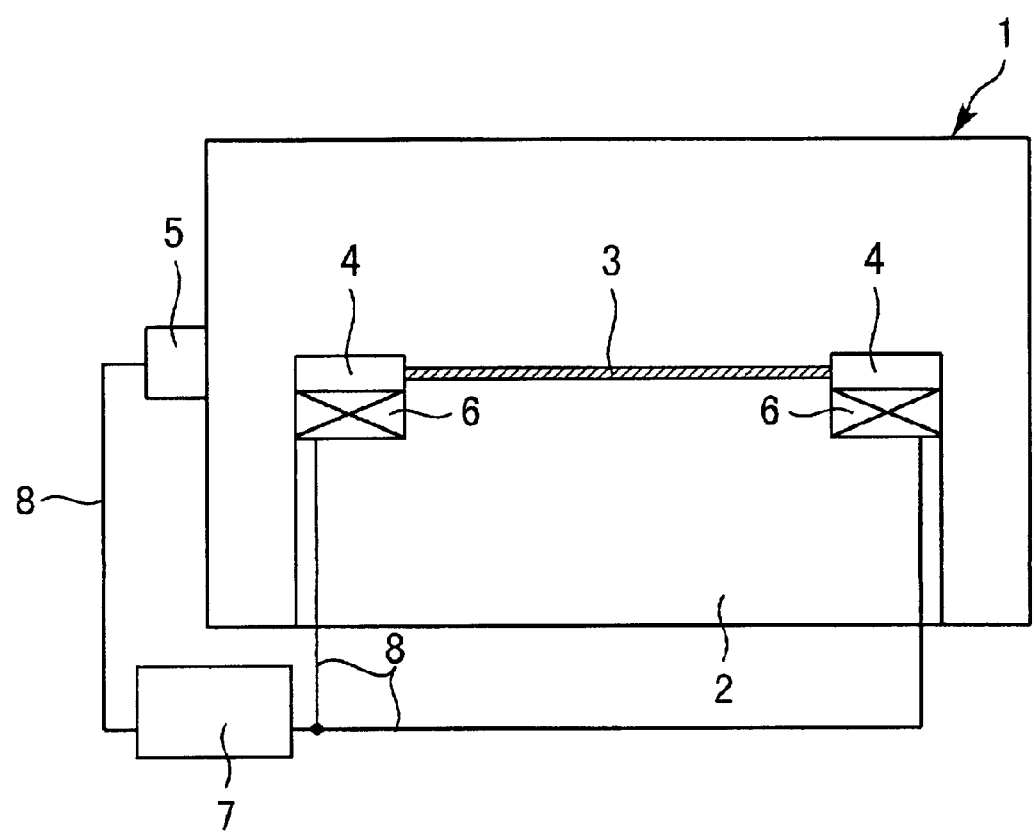
FIG. 1 is a conceptual diagram for illustrating a plasma etching apparatus and a plasma etching method according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

FIG. 1 is a conceptual diagram for illustrating a plasma etching apparatus and a plasma etching method according to a first embodiment of the present invention.

First, the configuration of a plasma etching apparatus according to the first embodiment will be described.

In FIG. 1, reference numeral 1 denotes an etching chamber, 2 denotes a lower electrode, 3 denotes a semiconductor substrate, 4 denotes a focus ring, 5 denotes a sensor, 6 denotes a drive mechanism, 7 denotes a controller, and 8 denotes a signal cable.

The etching chamber 1 is a chamber for etching the semiconductor substrate 3.

The lower electrode 2 is a cathode provided in the etching chamber 1, for supporting the semiconductor substrate 3 on the surface thereof.

The semiconductor substrate 3 is, for example, silicon substrate (silicon wafer) in this embodiment. A quartz substrate, a ceramic substrate or the like can be used in place of the semiconductor substrate 3.

The focus ring 4 is disposed along the circumferential part of the semiconductor substrate 3 so as to surround the substrate, for controlling plasma in the vicinity of the circumference of the semiconductor substrate 3. The focus ring 4 is formed of quartz or ceramics.

The sensor 5 is disposed of the side of the etching chamber 1, for measuring a height of the focus ring 4, i.e., the location of the upper surface of the focus ring 4. The sensor 5 is connected to the controller 7 through the signal cable 8, and outputs the results of measurement to the controller 7.

The drive mechanism 6 drives the focus ring 4 vertically, and is, for example, a lift mechanism disposed underneath the focus ring 4. The drive mechanism 6 is connected to the controller 7 through the signal cable 8. The drive mechanism 6 drives the focus ring 4 vertically on the basis of a control signal inputted from the controller 7.

The controller 7 is connected to the sensor 5 and the drive mechanism 6 through the signal cable 8. The controller 7 outputs control signals to the drive mechanism 6 on the basis of the measurement results inputted from the sensor 5, and controls the height of the upper surface of the focus ring 4 as desired.

For example, if the focus ring 4 is corroded, and the height of the upper surface of the focus ring 4 is lowered when plasma etching apparatus has been used for a long period of time, the controller 7 outputs control signals to the drive mechanism 6 to operate the drive mechanism 6 on the basis of the measurement results of the sensor 5. Thereby, the height of the upper surface of the focus ring 4 can be controlled as desired.

Here, the desired height means the height where the best etching characteristics can be obtained in the plasma etching apparatus.

To summarize the above-described plasma etching apparatus, the focus ring 4 is disposed along the circumferential portion of the semiconductor substrate 3 disposed on the lower electrode 2. The sensor 5 measures the height of the upper surface of the focus ring 4, and the drive mechanism 6 drives the focus ring 4 vertically. The controller 7 operates the drive mechanism 6 on the basis of the measurement results of the sensor 5, and adjusts the height of the upper surface of the focus ring 4 as desired.

Next, the operation of the plasma etching apparatus will be described below.

Before etching the semiconductor substrate 3, the height of the upper surface of the focus ring 4 will be adjusted as follows.

First, the sensor 5 measures the height of the upper surface of the focus ring 4, and outputs the result of measurement to the controller 7. At this time, the corroded (etched) quantity of the focus ring 4 is measured.

Next, the controller 7 outputs control signals to the drive mechanism 6 on the basis of the measurement results inputted form the sensor 5.

Then, the drive mechanism 6 drives the focus ring 4 upward or downward depending on control signals inputted from the controller 7.

Thus, the height of the upper surface of the focus ring 4 is adjusted to the desired position.

Thereafter, the semiconductor substrate 3 is subjected to etching by using the focus ring 4 adjusted as described above.

As described above, in the plasma etching apparatus, and the plasma etching method executed by using the plasma etching apparatus according to the first embodiment, the height of the upper surface of the focus ring 4 can be maintained constant, even if the focus ring 4 is corroded by the etching gas, and the height of the focus ring 4 is changed. That is, the length from the surface of the semiconductor substrate 3 to the upper surface of the focus ring 4 can be maintained constant.

Thereby, the etching characteristics at the circumferential portion of the wafer can be maintained constant. Accordingly, the uniformity of the etching rate on the entire surface of the wafer can be maintained constant.

Furthermore, since there is no need to replace the focus ring 4 even if the focus ring 4 is corroded and thinned, the focus ring 4 can be continuously used for a long period of time.

This lowers the running costs of the plasma etching apparatus.

Furthermore, when etching conditions (e.g., gas flow rate, pressure, PF power, and the open area of the resist) are varied, the height of the upper surface of the focus ring 4 can be adjusted to meet the conditions. That is, since the height of the focus ring 4 can be adjusted for every etching condition, the process margin of the etching process can be improved.

In the plasma etching apparatus according to the first embodiment, although the sensor 5 is installed on the side of the etching chamber 1, the location of installation is not limited thereto. For example, the sensor 5 can be installed on the upper surface of the etching chamber 1.

The height of the upper surface of the focus ring 4 may be adjusted after etching instead of before etching.

Also, the adjustment of the height of the focus ring 4 is not necessarily required to perform every etching, but may be performed depending on the quantity of corroded focus ring 4 due to etching. That is, the above-described adjustment may be performed after a prescribed number of wafers have been processed.

Second Embodiment

FIG. 2 is a conceptual diagram for illustrating a plasma etching apparatus and a plasma etching method according to a second embodiment of the present invention.

First, the configuration of a plasma etching apparatus according to the second embodiment will be described.

The plasma etching apparatus of Second Embodiment differs from the above-described plasma etching apparatus of First Embodiment in the sensor 5 and the drive mechanism 6.

The following description is focused on this difference.

In the plasma etching apparatus of Second Embodiment shown in FIG. 2, a plurality of sensors 5 are disposed on the upper surface of the etching chamber 1, in order to measure the height of the upper surface of the focus ring 4 at a plurality of locations (points). Each of the sensors 5 is connected to the controller 7 through signal cables 8, and outputs the result of measurement to the controller 7.

The drive mechanism 6 has a function to change the height of the upper surface of the focus ring 4 at a plurality of locations. For example, the drive mechanism 6 is composed of a plurality of drive units 61. Each drive unit 61 is connected to the controller 7 through the signal cable 8, and independently drives the focus ring 4 vertically on the basis of individual control signals inputted from the controller 7.

The controller 7 is connected to the plurality of sensors 5, and to the plurality of drive units 61 that compose the drive mechanism 6, through signal cables 8. The controller 7 outputs individual control signals to the plurality of drive units 61 on the basis of the measurement results inputted from the plurality of sensors 5, and controls the height of the upper surface of the focus ring 4 as desired.

For example, if a part of the focus ring 4 is corroded, and the height of the upper surface of the focus ring 4 is locally lowered when plasma etching apparatus has been used for a long period of time, the controller 7 outputs individual control signals to each of the drive units 6 to operate each drive unit 6 independently on the basis of the measurement results of the sensor 5. Thereby, the height of the upper surface of the focus ring 4 is controlled to the desired position.

Next, the operation of the plasma etching apparatus will be described below.

Before etching the semiconductor substrate 3, the height of the upper surface of the focus ring 4 will be adjusted as follows.

First, the plurality of sensors 5 measure the height of the upper surface of the focus ring 4 at a plurality of locations, and output the result of measurement to the controller 7 respectively.

Next, the controller 7 outputs individual control signals to a plurality of drive units 61 that compose the drive mechanism 6, on the basis of the measurement results inputted form the plurality of sensor 5.

Then, each drive unit 61 drives the focus ring 4 upward or downward depending on control signals inputted from the controller 7. That is, the drive mechanism 6 adjusts the height of the upper surface of the focus ring 4 at a plurality of locations.

Thus, the height of the upper surface of the focus ring 4 is adjusted to the desired position.

Thereafter, the semiconductor substrate 3 is subjected to etching using the focus ring 4 adjusted as described above.

As described above, according to the plasma etching apparatus of the second embodiment and the plasma etching method using the plasma etching apparatus, the height of the upper surface of the focus ring 4 can be maintained constant at a plurality of locations.

Therefore, for example, even if a part of the focus ring 4 is locally corroded due to use for a long period time, the height of the upper surface of the focus ring 4 can be maintained constant.

Thereby, the etching rate at the circumferential portion of the semiconductor substrate 3 can be maintained constant, and the uniformity of the etching rate on the entire surface of the wafer can be maintained constant without replacing any focus ring 4.

Even if the thickness of the focus ring 4 varies locally, since the focus ring 4 can be continuously used for a long period of time without replacing any focus ring 4, the running costs of the plasma etching apparatus can be saved.

Also, by adjusting the height of the upper surface of the focus ring 4 at a certain portion, the etching characteristics at the location can be changed.

In other words, by changing the height of the upper surface of the focus ring 4 locally, the state of plasma at the circumferential portion of the semiconductor substrate 3 is locally changed. Thereby, for example, the etching characteristics change because the quantity of supplied etchant or the exhausting characteristics change.

In the plasma etching apparatus according to the second embodiment, although a plurality of the sensors 5 are installed on the upper surface of the etching chamber 1, the location of installation is not limited thereto. For example, the number of the sensors 5 can be installed on the side of the etching chamber 1.

Also, the height of the upper surface of the focus ring 4 at a plurality of locations may be measured by allowing a single sensor 5 to scan sequentially without providing a plurality of sensors 5. In this case, the scanning of the sensor 5 is controlled by the controller 7.

The drive mechanism 6 is not limited to the mechanism composed of a plurality of drive units 61 as described above, but it may be, for example, an integral mechanism to be supported at three points and to adjust the surface to support the focus ring 4 to desired angle and height.

This invention, when practiced illustratively in the manner described above, provides the following major effects:

The height of the upper surface of the focus ring can be maintained constant without replacing any focus ring. Therefore, the etching rate at the circumferential portion of the semiconductor substrate can be maintained constant.

Further, the present invention is not limited to these embodiments, but variations and modifications may be made without departing from the scope of the present invention.

The entire disclosure of Japanese Patent Application No. 2000-372798 filed on Dec. 7, 2000 containing specification, claims, drawings and summary are incorporated herein by reference in its entirety.

What is claimed is:

1. A plasma etching apparatus comprising:

a lower electrode supporting a semiconductor substrate;

a focus ring disposed along a circumference of said semiconductor substrate;

a sensor for measuring a position of an upper surface of said focus ring;

a drive mechanism for driving said focus ring vertically; and a controller for adjusting the position of the upper surface of said focus ring by driving said drive mechanism on the basis of a result of measurement by said sensor.

2. The plasma etching apparatus according to claim 1, wherein said sensor can measure the position of the upper surface of said focus ring at a plurality of points of said focus ring, and said drive mechanism can change the position of the upper surface of said focus ring at a plurality of points of said focus ring.

3. The plasma etching apparatus according to claim 2, wherein said controller is configured for adjusting the position of said upper surface of said focus ring to maintain constant a length from a surface of said semiconductor substrate to said upper surface of said focus ring at a plurality of locations of said upper surface.

4. The plasma etching apparatus according to claim 2, wherein said controller is configured for adjusting the position of said upper surface of said focus ring to maintain constant the uniformity of the etching rate of a surface of said semiconductor substrate.

5. The plasma etching apparatus according to claim 1, wherein said controller is configured for adjusting the position of said upper surface of said focus ring to maintain constant a length from a surface of said semiconductor substrate to said upper surface of said focus ring.

6. The plasma etching apparatus according to claim 1, wherein said controller is configured for adjusting the position of said upper surface of said focus ring to maintain constant the uniformity of the etching rate of a surface of said semiconductor substrate.

* * * * *